United States Patent
Kwon et al.

(10) Patent No.: US 9,059,149 B2
(45) Date of Patent: Jun. 16, 2015

(54) ELECTRONIC DEVICE PACKAGE AND PACKAGING SUBSTRATE FOR THE SAME

(71) Applicant: SAMSUNG ELECTRONICS CO., LTD., Suwon-si, Gyeonggi-do (KR)

(72) Inventors: Yong Min Kwon, Seoul (KR); Seo Hyun Moon, Cheongju-si (KR); Sung Jun Im, Yongin-si (KR); Min Young Son, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/063,806

(22) Filed: Oct. 25, 2013

(65) Prior Publication Data

US 2014/0203451 A1    Jul. 24, 2014

(30) Foreign Application Priority Data

Jan. 22, 2013  (KR) ........................ 10-2013-0007021

(51) Int. Cl.
*H01L 23/48*    (2006.01)

(52) U.S. Cl.
CPC ....... *H01L 23/481* (2013.01); *H01L 2924/0002* (2013.01); *Y02E 10/50* (2013.01)

(58) Field of Classification Search
CPC ......... H01L 23/48; H01L 24/01; H01L 24/06; H01L 24/09; H01L 33/62; H01L 33/486; H01L 23/481; H01L 2924/0002
See application file for complete search history.

(56) References Cited

U.S. PATENT DOCUMENTS

| | | |
|---|---|---|
| 2003/0146445 A1 | 8/2003 | Hen |
| 2006/0243999 A1 | 11/2006 | Shen |
| 2006/0261292 A1 | 11/2006 | Kim et al. |
| 2009/0022198 A1 | 1/2009 | Chen et al. |
| 2009/0273002 A1* | 11/2009 | Chiou et al. ............... 257/99 |
| 2011/0057217 A1* | 3/2011 | Peng et al. ............... 257/98 |
| 2011/0156579 A1 | 6/2011 | Jo et al. |
| 2011/0175122 A1 | 7/2011 | Kim |
| 2012/0074441 A1 | 3/2012 | Seo et al. |
| 2012/0181569 A1* | 7/2012 | Choi ............... 257/99 |
| 2012/0286419 A1* | 11/2012 | Kwon et al. ............... 257/737 |
| 2013/0146936 A1* | 6/2013 | Tsai et al. ............... 257/99 |
| 2014/0061951 A1* | 3/2014 | Lee ............... 257/777 |
| 2014/0167237 A1* | 6/2014 | Yoo et al. ............... 257/676 |

* cited by examiner

*Primary Examiner* — A. Sefer (74) *Attorney, Agent, or Firm* — McDermott Will & Emery LLP (57) ABSTRACT

The present application provides an electronic device package. The package includes a packaging substrate having first and second surfaces opposing one another. First and second electrode patterns are formed on the first surface and first and second external terminals connected to the first and second electrode patterns. The second electrode pattern is electrically insulated from the first electrode pattern and surrounds the first electrode pattern An electronic device is mounted on the first surface of the packaging substrate and includes first and second electrodes disposed on a surface thereof facing the packaging substrate. The first and second electrodes are positioned on the first and second electrode patterns, respectively.

13 Claims, 7 Drawing Sheets

ELECTRONIC DEVICE PACKAGE AND PACKAGING SUBSTRATE FOR THE SAME

CROSS-REFERENCE TO RELATED APPLICATIONS

This application claims priority under 35 U.S.C. §119 to Korean Patent Application No. 10-2013-0007021 filed on Jan. 22, 2013, in the Korean Intellectual Property Office, the disclosure of which is incorporated by reference herein in its entirety.

TECHNICAL FIELD

The present disclosure relates to an electronic device package, in particular, to an optoelectronic device package, and a packaging substrate for the same.

BACKGROUND

An electronic device is a device capable of being driven by receiving externally supplied electrical energy, and includes optoelectronic devices such as a semiconductor light emitting device, a solar cell and the like.

In general, the electronic device may be mounted in a desired apparatus in a packaging state. A packaging substrate used in a packaging process may have electrode patterns corresponding to electrodes of the electronic device. These electrode patterns may be spaced apart from one another by an electrode separation region in which the electrodes are not formed between the electrode patterns.

Even in a state in which the electronic device is mounted on the packaging substrate by being connected to the electrode patterns, both ends of the electrode separation region are externally open. Therefore, an active region of the electronic device in which the electrodes are formed may be externally exposed, resulting in a reduction in the reliability of the electronic device.

SUMMARY

An aspect of the present disclosure provides an electronic device package having a structure in which an electrode separation region is not open externally, so as to prevent a reduction in reliability of an electronic device and enhance the characteristics thereof, and a packaging substrate for the same.

According to an aspect of the present disclosure, there is provided an electronic device package including: a packaging substrate having first and second surfaces opposing one another, including first and second electrode patterns formed on the first surface and first and second external terminals connected to the first and second electrode patterns, the second electrode pattern being electrically insulated from the first electrode pattern and surrounding the first electrode pattern; an electronic device mounted on the first surface of the packaging substrate and including first and second electrodes formed on a surface thereof facing the packaging substrate, the first and second electrodes being positioned on the first and second electrode patterns, respectively.

The electronic device package may further include a first conductive via penetrating through the packaging substrate to connect the first electrode pattern to the first external terminal, wherein the first external terminal may be provided on the second surface of the packaging substrate.

The electronic device package may further include a second conductive via penetrating through the packaging substrate to connect the second electrode pattern to the second external terminal, wherein the second external terminal may be provided on the second surface of the packaging substrate.

The first electrode pattern may include a plurality of first electrode patterns separated from one another.

The second electrode may be separated from the first electrode and be provided to surround the first electrode. The second electrode pattern and the second electrode may be bonded to one another and an internal space defined by a bonding region thereof may be sealed.

The second electrode may be disposed around the first electrode and include a plurality of second electrodes separated from one another. In this case, the plurality of second electrodes may be arranged in a symmetrical manner based on the first electrode.

The first and second electrodes of the electronic device may have thicknesses less than those of the first and second electrode patterns.

The electronic device may be an optoelectronic device. Here, a portion of the second electrode pattern may be continuously exposed along edges of the electronic device.

According to another aspect of the present disclosure, there is provided a packaging substrate for an electronic device, the packaging substrate including: a substrate body having first and second surfaces opposing one another; a first electrode pattern formed on the first surface of the substrate body; a second electrode pattern formed on the first surface of the substrate body, electrically insulated from the first electrode, and surrounding the first electrode pattern; and first and second external terminals connected to the first and second electrode patterns, respectively.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Embodiments of the present disclosure will now be described in detail with reference to the accompanying drawings.

The inventive concept of the disclosure may, however, be exemplified in many different forms and should not be construed as being limited to the specific embodiments set forth herein. Rather, these embodiments are provided so that this disclosure will be thorough and complete, and will fully convey the scope of the inventive concept to those skilled in the art.

In the drawings, the shapes and dimensions of elements may be exaggerated for clarity, and the same reference numerals will be used throughout to designate the same or like elements.

Figure 1:
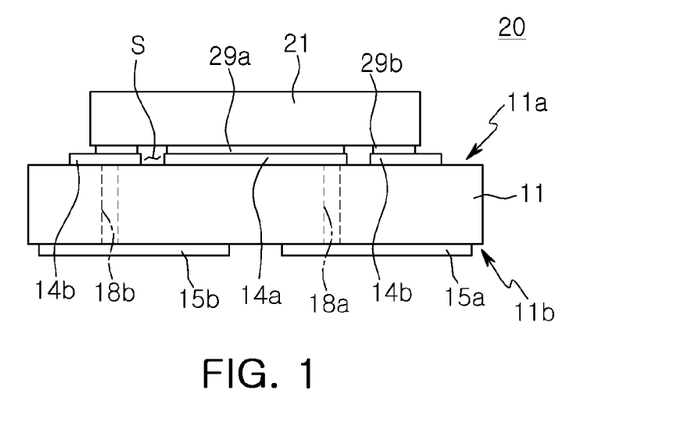
FIG. 1 is a cross-sectional view of an electronic device package according to an embodiment of the present inventive concept.
Figure 2:
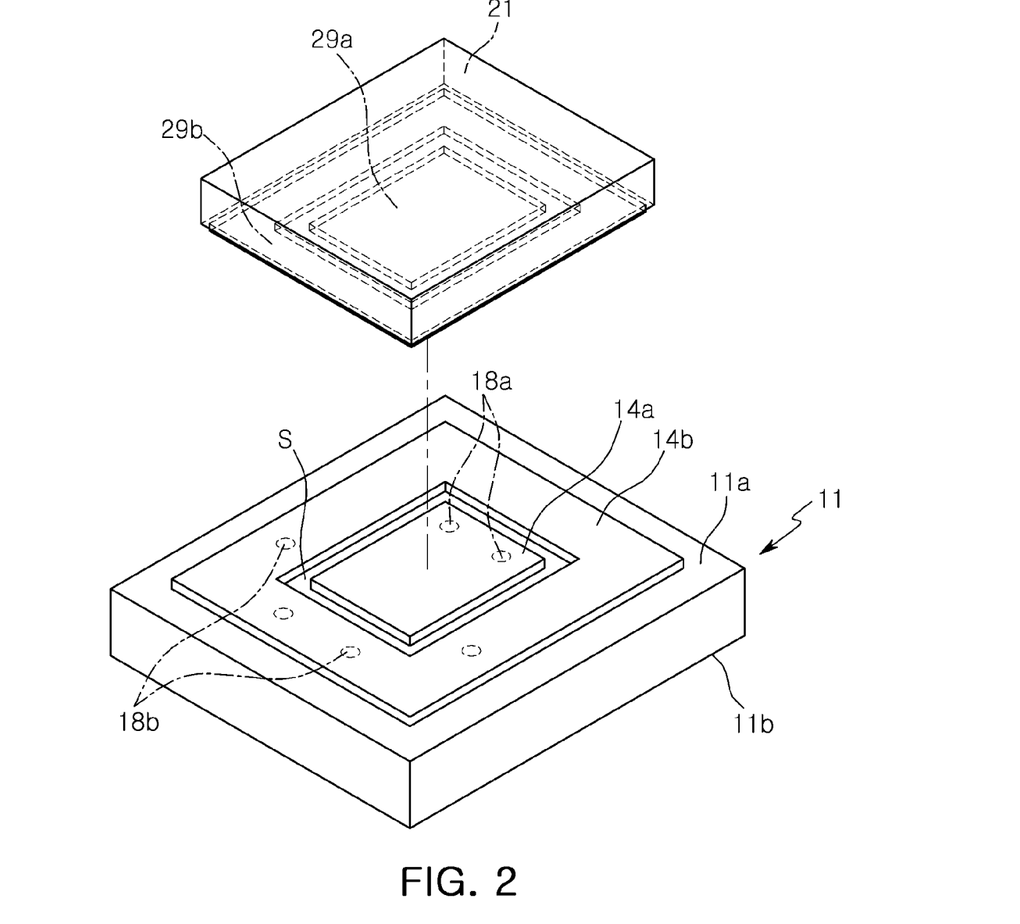
FIG. 2 is an exploded perspective view illustrating main elements of the electronic device package of FIG. 1.

FIG. 1 is a cross-sectional view of an electronic device package according to an embodiment of the present inventive concept, and FIG. 2 is an exploded perspective view illustrating main elements of the electronic device package of FIG. 1.

As shown in FIG. 1, an electronic device package 20 may include a packaging substrate 11 including a substrate body having first and second surfaces 11a and 11b opposing one another and an electronic device 21 mounted on the first surface 11a of the packaging substrate 11.

The packaging substrate 11 may include first and second electrode patterns 14a and 14b formed on the first surface 11a and first and second external terminals 15a and 15b connected to the first and second electrode patterns 14a and 14b, respectively. The packaging substrate 11 is exemplified as an insulating substrate such as a polymer substrate, a ceramic substrate or the like, but the packaging substrate 11 may be a semiconductor substrate such as a silicon substrate, as necessary. According to the present embodiment, the first and second electrode patterns 14a and 14b may be connected to the first and second external terminals 15a and 15b by first and second conductive vias 18a and 18b penetrating through the packaging substrate 11.

The electronic device 21 may be mounted on the first surface 11a of the packaging substrate 11, and may include first and second electrodes 29a and 29b formed on a mounting surface thereof facing the first surface 11a of the packaging substrate 11. The electronic device 21 may be various types of electronic device capable of being driven by receiving electrical energy through first and second electrodes thereof. For example, the electronic device 21 applicable to the present embodiment may be an optoelectronic device such as a semiconductor light emitting device, a solar cell, or the like.

In the packaging substrate 11 according to the present embodiment, the second electrode pattern 14b may be electrically insulated from the first electrode pattern 14a while surrounding the first electrode pattern 14a. That is, as shown in FIG. 2, since the first and second electrode patterns 14a and 14b are separated from one another by an electrode separation region S in which no electrode pattern is formed and the second electrode pattern 14a is formed to surround the first electrode pattern 14a, the electrode separation region S may have a closed form.

As shown in FIG. 2, a plurality of first and second conductive vias 18a and 18b are provided in necessary positions. In the present embodiment, as shown in FIG. 1, the first and second external terminals 15a and 15b may be positioned towards both ends of the second surface 11b of the packaging substrate 11, in a manner different from the shapes and arrangements of the first and second electrode patterns 29a and 29b.

The first and second electrodes 29a and 29b may be positioned to correspond to the first and second electrode patterns 14a and 14b. When the electronic device 21 is mounted on the packaging substrate 11, the first and second electrodes 29a and 29b may be bonded to the first and second electrode patterns 14a and 14b disposed in positions corresponding thereto. Although not shown, such a bonding process may be performed using a bonding metal such as Au, Sn, or Au/Sn or a conductive polymer. Alternatively, for example, in the case of a chip scale package (CSP) manufacturing process, a direct bonding method may be used.

In particular, the first and second electrodes 29a and 29b of the electronic device 21 may be provided as shown in FIG. 2, similar to the first and second electrode patterns 14a and 14b. That is, the first electrode 29a may be provided in a central region of the mounting surface so as to correspond to a region of the first surface 11a in which the first electrode pattern 14a is formed. The second electrode 29b may be provided to surround the first electrode 29a and may be positioned to correspond to a region of the first surface in which the second electrode pattern 14b is formed.

Therefore, in the case in which the electronic device 21 is mounted on the first surface 11a of the packaging substrate 11 and the first and second electrodes 29a and 29b are bonded to the first and second electrode patterns 14a and 14b, respectively, the electrode separation region S between the first and second electrode patterns 14a and 14b is not exposed externally. In particular, as shown in FIG. 2, the second electrode 29b of the electronic device 21 may be continuously bonded to the second electrode pattern 14b of the packaging substrate 11, such that the electrode separation region S may be sealed.

In the present embodiment, the first and second electrode patterns 14a and 14b are connected to the first and second external terminals 15a and 15b by the first and second conductive vias 18a and 18b penetrating through the packaging substrate 11. Alternatively, since the first electrode pattern 14a disposed on the first surface 11a of the packaging substrate 11 is enclosed by the second electrode pattern 14b, only the first electrode pattern 14a may be connected to the first external terminal 15a using the first conductive via 18a. The second electrode pattern 14b may be extended to lateral surfaces of the packaging substrate 11 and connected to the second external terminal 15b without a via structure.

Meanwhile, at least one of the first and second conductive vias 18a and 18b may not completely penetrate through the packaging substrate 11. For example, in the case in which the packaging substrate has a multilayer structure (for example, a multilayer ceramic substrate), the first and second conductive vias 18a and 18b may not completely penetrate through the packaging substrate, instead, they may be extended to circuit patterns positioned in an intermediate layer of the multilayer structure to be connected to the external terminals.

In addition, unlike the above-described embodiment, the electrode patterns of the packaging substrate and the electrodes of the electronic device may be configured in various forms.

Figure 3A:
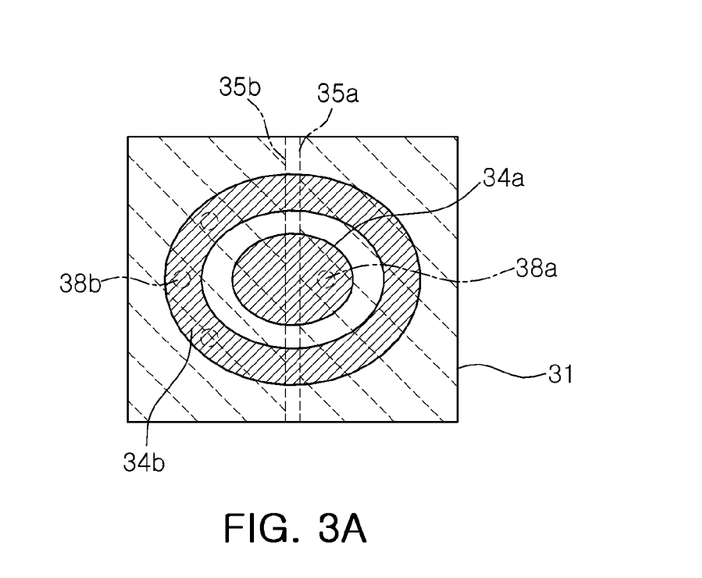
FIGS. 3A and 3B are plan views illustrating examples of electrode patterns applicable to a packaging substrate according to an embodiment of the present inventive concept.
Figure 3B:
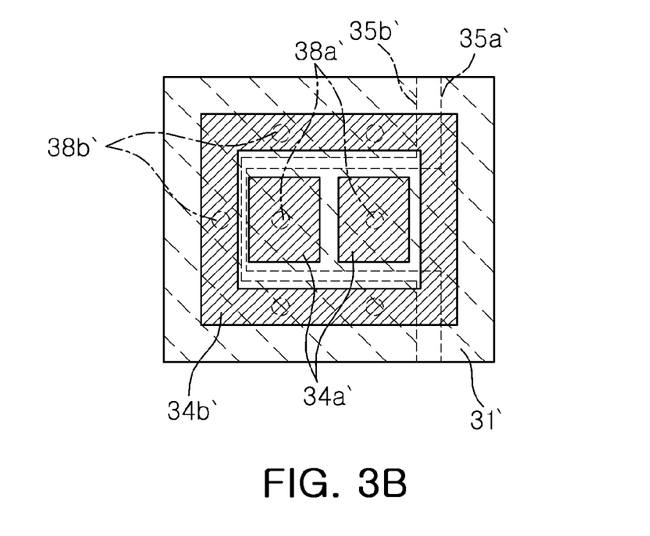

FIGS. 3A and 3B are plan views illustrating examples of electrode patterns applicable to a packaging substrate according to an embodiment of the present inventive concept.

A packaging substrate 31 in FIG. 3A may include first and second electrode patterns 34a and 34b formed on a top surface thereof, the first electrode pattern 34a having an elliptical shape and the second electrode pattern 34b surrounding the first electrode pattern 34a. The packaging substrate 31 may have first and second external terminals 35a and 35b positioned toward both ends of a bottom surface thereof, the first and second external terminals 35a and 35b being separated from one another. The first electrode pattern 34a may be connected to the first external terminal 35a by a single first conductive via 38a, and the second electrode pattern 34b may be connected to the second external terminal 35b by three second conductive vias 38b.

As described above, since the second electrode pattern 34b surrounds the first electrode pattern 34a, an electrode separation region may have a closed form. The first and second electrode patterns 34a, 34b may have variable forms and shapes so long as they are formed in the above-described manner.

For example, the first electrode pattern 34a may have different shapes such as a square, a circle, and the like, besides a rectangle and an ellipse. In addition, the first electrode pattern 34a may be provided as a plurality of electrode patterns, rather than as a single electrode pattern. FIG. 3B illustrates that the first electrode pattern 34a is provided as a plurality of electrode patterns.

As shown in FIG. 3B, a packaging substrate 31' includes two first electrode patterns 34a' having a rectangular shape and a single second electrode pattern 34b' surrounding the first electrode patterns 34a' on a top surface thereof. In this embodiment, first and second external terminals 35a' and 35b' may be formed on a bottom surface of the packaging substrate 31' in a manner such that the first external terminal 35a' may be extended so as to encompass a region of the bottom surface of the packaging substrate 31' corresponding to the first electrode pattern 34a' formed on the top surface, and the second external terminal 35b' may have a '⊏' shape so as to be spaced apart from the first external terminal 35a' by a predetermined interval. The two first electrode patterns 34a' may be connected to the first external terminal 35a' by respective first conductive vias 38a' and the second electrode pattern 34b' may be connected to the second external terminal 35b' by five second conductive vias 38b'.

In the present embodiment, the plurality of first electrode patterns 34a' may be provided and the second electrode pattern 34b' may surround the plurality of first electrode patterns 34a', such that an electrode separation region may not be externally exposed.

The electronic device employed in an embodiment of the present inventive concept may have various electrode structures. In particular, since a thickness of the electrode employed in the electronic device (e.g., 1 µm to 3 µm) is significantly less than that of the electrode pattern employed in the packaging pattern (e.g., 10 µm to 100 µm), the penetration of foreign objects may be effectively prevented by only allowing the electrode separation region between the electrode patterns not to be exposed externally. Accordingly, in another embodiment, electrodes of the electronic device may be arranged to be open so long as the electrode separation region between the electrode patterns is not exposed externally.

Figure 4A:
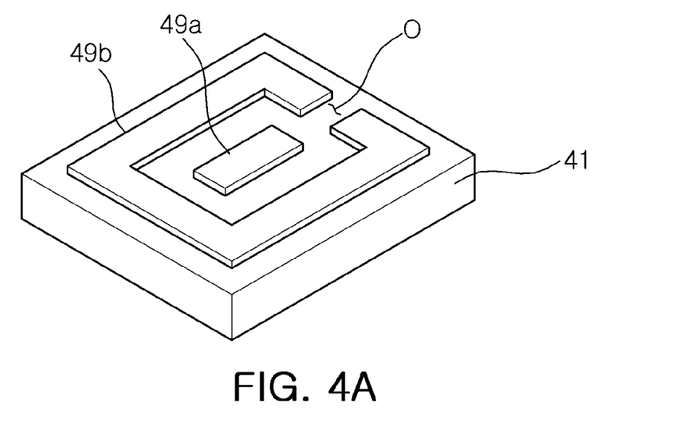
FIGS. 4A and 4B are perspective views illustrating examples of electrodes applicable to an electronic device according to an embodiment of the present inventive concept.
Figure 4B:
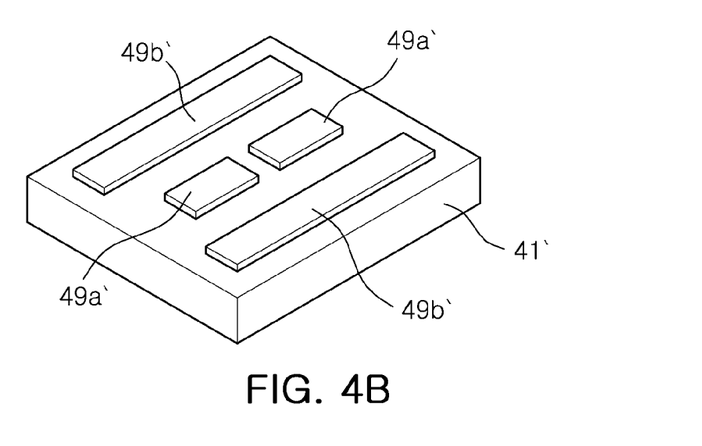

FIGS. 4A and 4B are plan views illustrating examples of electrodes applicable to an electronic device according to an embodiment of the present inventive concept. First and second electrodes of an electronic device of FIGS. 4A and 4B may be bonded to a packaging substrate having electrode patterns similar to the electrode patterns of the packaging substrate 11 employed in the embodiment of FIG. 1.

An electronic device 41 of FIG. 4A may include first and second electrodes 49a and 49b formed on a mounting surface thereof. The first and second electrodes 49a and 49b may be positioned to correspond to the first and second electrode patterns formed on the packaging substrate 11 of FIG. 1. Unlike the electronic device 21 of FIG. 1, the second electrode 49b may be provided to have a partially open portion O without completely surrounding the first electrode 49a. Even in the case that a portion of the second electrode 49b is open, the thickness of the first and second electrodes 49a and 49b of the electronic device 41 is relatively less than the thickness of the electrode patterns of the packaging substrate, whereby the electronic device 41 may be less affected by the penetration of foreign objects or moisture thereinto through the open portion O.

An electronic device 41' of FIG. 4B may include two first electrodes 49a' and two second electrodes 49b'. The first and second electrodes 49a' and 49b' may be positioned to correspond to the electrode patterns of the packaging substrate. Unlike the electrodes of FIG. 4A, the first electrodes 49a' may be provided as two separated electrodes and the second electrodes 49b' may be provided as two rectangular electrodes arranged in a symmetrical manner based on the first electrodes 49a'. The two first electrodes 49a' in the present embodiment are arranged in positions corresponding to the two first electrode patterns 34a' of FIG. 3B, such that independent connection may be ensured.

As described above, the electronic device may have various arrangements of first and second electrodes. The second electrode may be disposed around the first electrode and may include a plurality of second electrodes separated from one another. In this example, the second electrodes may be arranged in a symmetrical manner based on the first electrode, so that the electronic device may be stably mounted.

The electronic device applicable to embodiments of the present inventive concept may be a semiconductor light emitting device. As described above, the second electrode pattern of the packaging substrate has a closed structure, and a partial region of the second electrode pattern is continuously exposed along edges of the semiconductor light emitting device mounted thereon. The continuously exposed region of the second electrode pattern may serve as a reflective member useful in improving the light distribution characteristics of the semiconductor light emitting device across an entire orientation angle of light.

As an example of an electronic device package capable of providing the above-described advantages, a semiconductor light emitting device package may employ a semiconductor light emitting device (e.g., an LED chip) having various structures. Hereinafter, various types of semiconductor light emitting device applicable to embodiments of the present inventive concept will be described in detail.

Figure 5:
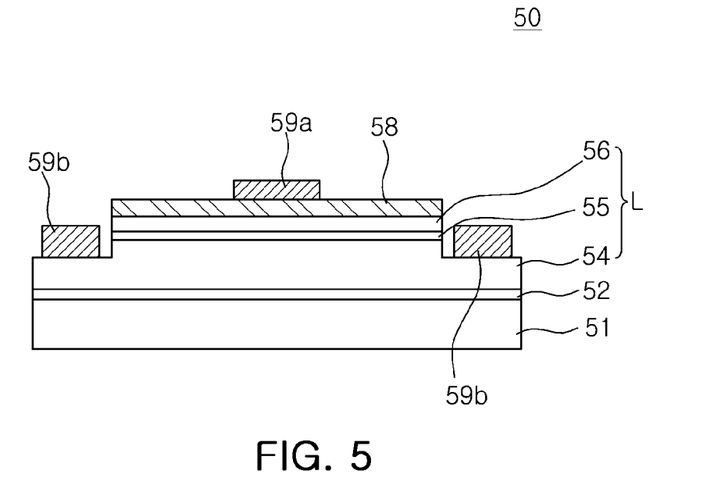
FIG. 5 is a cross-sectional view illustrating an example of a semiconductor light emitting device applicable to an embodiment of the present inventive concept.

FIG. 5 is a cross-sectional view illustrating an example of a semiconductor light emitting device applicable to an embodiment of the present inventive concept.

As shown in FIG. 5, a semiconductor light emitting device 50 may include a light emitting lamination L formed on a substrate 51. The light emitting lamination L may include a first conductivity type semiconductor layer 54, an active layer 55 and a second conductivity type semiconductor layer 56.

Throughout the specification, terms such as 'upper portion,' 'top surface,' 'lower portion,' 'bottom surface,' 'lateral surface,' and the like are based on the accompanying drawings, and they may be readily changed in actuality according to the orientation of the device.

The semiconductor light emitting device 50 may include an ohmic contact layer 58 formed on the second conductivity type semiconductor layer 56, and first and second electrodes 59a and 59b formed on a top surface of the ohmic contact layer 58 and an exposed region of the first conductivity type semiconductor layer 54, respectively.

The surface of the semiconductor light emitting device 50 on which the first and second electrodes 59a and 59b are formed may be provided as a mounting surface of the semiconductor light emitting device 50. That is, the first and second electrodes 59a and 59b may be positioned to correspond to the first and second electrode patterns (see FIGS. 1, 3A and 3B) of the packaging substrate.

Since the substrate 51 of the semiconductor light emitting device 50 is provided as a light emitting surface, the substrate 51 may be a light transmissive substrate. In addition, the ohmic contact layer 58 may have high reflective ohmic contact properties.

In the semiconductor light emitting device 50 as shown in FIG. 5, a circumferential portion of the light emitting lamination L may be mesa-etched, such that a portion of the first conductivity type semiconductor layer 54 may be exposed. The second electrode 59b formed on the exposed portion of the first conductivity type semiconductor layer 54 may surround the first electrode 59a. In addition, as shown in FIGS. 4A and 4B, the second electrode 59b may not completely surround the first electrode 59a or may be provided as a plurality of electrodes appropriately arranged around the first electrode 59a.

Hereinafter, essential elements of the semiconductor light emitting device 50 will be described in detail.

Substrate 51

Throughout the specification, the substrate 51 employed in the semiconductor light emitting device 50 is distinguished from a packaging substrate. The substrate 51 may be an insulating substrate, a conductive substrate or a semiconductor substrate according to necessity. For example, the substrate 51 may be formed of sapphire, SiC, Si, $MgAl_2O_4$, MgO, $LiAlO_2$, $LiGaO_2$, GaN or the like. The substrate 51 may be a homogeneous substrate formed of the same material as that of the semiconductor layers. For example, the homogeneous substrate may be formed of GaN. The GaN substrate may be suitable for epitaxial growth of the GaN semiconductor layers, but the GaN substrate involves relatively high manufacturing costs due to difficulties in a manufacturing process thereof.

As a heterogeneous substrate, a sapphire substrate, a silicon carbide (SiC) substrate, or the like is generally used. The sapphire substrate is relatively economical as compared to the SiC substrate, and thus, the sapphire substrate is more frequently utilized. When the heterogeneous substrate is used, a difference in lattice constants between the substrate material and the material of the semiconductor layers (thin film material) may cause an increase in defects such as dislocations and the like. In addition, a difference in thermal expansion coefficients between the substrate material and the thin film material may cause warpage at the time of a temperature change, and the warpage may result in the occurrence of cracks in the semiconductor layers. This problem may be alleviated by the use of a buffer layer 52 (FIG. 5) between the substrate and the light emitting lamination L that is a semiconductor single crystal.

After the growth of the light emitting lamination, the substrate 51 may be completely or partially removed or may be subjected to patterning during a chip manufacturing process in order to improve optical or electrical characteristics of the semiconductor light emitting device.

For example, in the case of a sapphire substrate, a laser may be irradiated onto an interface between the substrate and a nitride semiconductor layer and the substrate may be separated therefrom, and in the case of a silicon substrate or a silicon carbide substrate, the substrate may be removed by a polishing process, an etching process or the like.

The patterning of the substrate allows main surfaces or lateral surfaces of the substrate to have patterns of unevenness portions or inclined portions before or after the growth of the light emitting lamination, thereby improving light extraction efficiency. The size of the patterns formed by the patterning process may range from 5 nm to 500 μm, and the regular or irregular patterns may have various structures so long as they may improve light extraction efficiency. The patterns may have various shapes such as a pillar shape, a pyramidal shape, a hemispherical shape, or the like.

A sapphire substrate for growing a nitride single crystal is formed of a crystal having Hexa-Rhombo R3c symmetry, and has a lattice constant of 13.001 Å in a C-axis and a lattice constant of 4.758 Å in an A-axis. Orientation planes of the sapphire substrate include a C (0001) plane, an A (1120) plane, an R (1102) plane, and the like. In particular, the C plane is mainly used as a substrate for nitride growth as it facilitates the growth of a nitride film and is stable at high temperatures.

Meanwhile, a silicon (Si) substrate may be used as the substrate 51. The use of a silicon substrate, which should have a large diameter and be relatively low in price, may facilitate mass-production. A difference in lattice constants between the Si substrate including a (111) plane as an orientation plane and GaN is approximately 17%, and a technology for suppressing the generation of crystalline defects due to the difference in lattice constants is required. In addition, a difference in thermal expansion coefficients between the Si substrate and GaN is approximately 56%, and a technology for suppressing the generation of warpage of the substrate due to the difference in thermal expansion coefficients is required. The warpage of the substrate may cause cracks in a GaN thin film and difficulties in the control of the formation of the GaN thin film, resulting in an increase in the distribution of wavelengths of emitted light within the same substrate.

Buffer Layer 52

When a GaN thin film is grown on a heterogeneous substrate such as a silicon (Si) substrate, a difference in lattice constants between the substrate material and the thin film material may cause an increase in dislocation density, and a difference in thermal expansion coefficients therebetween may cause cracks and warpage. In order to prevent dislocation and cracks in the light emitting lamination L, the buffer layer 52 may be provided between the substrate 51 and the light emitting lamination L. The buffer layer 52 may also serve to reduce the distribution of wavelengths of light by adjusting the degree of warpage of the substrate at the time of growing the active layer.

The buffer layer 52 may be formed of a material expressed by a composition of $Al_xIn_yGa_{1-x-y}N$ (0≤x≤1, 0≤y≤1), in particular, GaN, AlN, AlGaN, InGaN, or InGaNAlN. As necessary, $ZrB_2$, $HfB_2$, ZrN, HfN, TiN or the like may also be used therefor. In addition, the buffer layer 52 may be formed by combining a plurality of layers or the composition thereof may be gradually varied.

Since the Si substrate has a higher thermal expansion coefficient than GaN, when a GaN thin film is grown on the Si substrate by growing the GaN thin film at a high temperature and then cooling the same at room temperature, a difference in thermal expansion coefficients between the Si substrate and the GaN thin film may cause tensile stress applied to the GaN thin film, so that cracks may easily be generated in the GaN thin film. In order to prevent cracks, compressive stress may be applied to the GaN thin film during the growth thereof, thereby compensating for the tensile stress.

A possibility of the occurrence of defects due to the difference in lattice constants between the Si substrate and the GaN thin film may be high. In the case of using the Si substrate, it is necessary to control stress for suppressing warpage, as well as the control of defects, and thus, a buffer layer having a complex structure may be used.

For example, an AlN buffer layer may be formed on the substrate 51. In order to prevent a reaction between Si and Ga, a material having no element of Ga may be used for the buffer layer. SiC as well as AlN may also be used. Such a buffer layer may be grown on the substrate at a temperature ranging from 400° C. to 1300° C. using an Al source and an N source. As necessary, an AlGaN intermediate layer may be interposed between a plurality of AlN layers in order to control stress.

Light Emitting Lamination L

The light emitting lamination L may be formed of group III nitride semiconductors. The first and second conductivity type semiconductor layers 54 and 56 may be a nitride single crystal expressed by $Al_xIn_yGa_{1-x-y}N$ ($0 \leq x \leq 1$, $0 \leq y \leq 1$, $0 \leq x+y \leq 1$). However, the material of the semiconductor layers is not limited thereto, and AlGaInP semiconductors, AlGaAs semiconductors or the like may also be used therefor.

The first and second conductivity type semiconductor layers 54 and 56 may be formed of semiconductors doped with n-type and p-type impurities, respectively. On the contrary, the first and second conductivity type semiconductor layers 54 and 56 may be formed of semiconductors doped with p-type and n-type impurities, respectively.

Meanwhile, the first and second conductivity type semiconductor layers 54 and 56 may have a single layered structure. As necessary, the first and second conductivity type semiconductor layers 54 and 56 may have a multilayer structure having different compositions, different thicknesses, and the like. For example, the first and second conductivity type semiconductor layers 54 and 56 may include a carrier injection layer capable of improving the injection efficiency of electrons and holes. In addition, the first and second conductivity type semiconductor layers 54 and 56 may have a superlattice structure.

The first conductivity type semiconductor layer 54 may further include a current diffusion layer (not shown) adjacent to the active layer 55. The current diffusion layer may have a structure in which a plurality of $In_xAl_yGa_{(1-x-y)}N$ layers having different compositions or different contents of impurities are repeatedly laminated, or an insulating material layer is partially formed therein.

The second conductivity type semiconductor layer 56 may further include an electron blocking layer (not shown) adjacent to the active layer 55. The electron blocking layer may have a structure in which a plurality of $In_xAl_yGa_{(1-x-y)}N$ layers having different compositions are laminated or one or more $Al_yGa_{(1-y)}N$ layers are laminated. Since the electron blocking layer has an energy band gap greater than that of the active layer 55, it prevents electrons from penetrating into the second conductivity type (p-type) semiconductor layer 56.

The light emitting lamination L may be formed by using a metal organic chemical vapor deposition (MOCVD) device. As a manufacturing method thereof, reaction gases, that is, an organometallic compound gas (e.g., TMG, TMA or the like) and a nitrogen-containing gas (e.g., $NH_3$ or the like) may be supplied to a reaction chamber in which the substrate 51 is disposed. The temperature of the substrate may be maintained at a high temperature ranging from 900° C. to 1100° C. and GaN-based compound semiconductors may be grown on the substrate. As necessary, while an impurity gas is supplied thereto, the GaN-based compound semiconductors may be grown as undoped, n-type or p-type layer. Si is well-known as an n-type impurity, and Zn, Cd, Be, Mg, Ca, Ba or the like is used as a p-type impurity, in particular, Mg and Zn are frequently used.

In addition, the active layer 55 disposed between the first and second conductivity type semiconductor layers 54 and 56 may have a multi-quantum well (MQW) structure in which quantum well layers and quantum barrier layers are alternately laminated. For example, in the case of nitride semiconductors, a GaN/InGaN structure may be used. Alternatively, the active layer 55 may have a single quantum well (SQW) structure.

Ohmic Contact Layer 58 and First and Second Electrodes 59*a* and 59*b*

The ohmic contact layer 58 may reduce ohmic contact resistance by allowing the concentration of impurities to be relatively high, thereby reducing an operating voltage of the device and improving the characteristics of the device. As described above, the semiconductor light emitting device 50 may have a flip-chip structure as shown in FIG. 5 in which the first and second electrodes 59*a* and 59*b* are disposed in a direction opposite to a direction towards a light extraction surface. The ohmic contact layer 58 may be a high reflective ohmic contact layer and may include a high reflective material. For example, the ohmic contact layer 58 may be formed as a single layer or a plurality of layers including at least one selected from the group consisting of Ag, Ni, Al, Rh, Pd, Ir, Ru, Mg, Zn, Pt, and Au. In addition, the ohmic contact layer 58 may further include a GaN, InGaN, ZnO or graphene layer.

The first and second electrodes 59*a* and 59*b* may include Ag, Ni, Al, Rh, Pd, Ir, Ru, Mg, Zn, Pt, Au or the like and may have a two or more layered structure such as Ni/Ag, Zn/Ag, Ni/Al, Zn/Al, Pd/Ag, Pd/Al, Ir/Ag. Ir/Au, Pt/Ag, Pt/Al, Ni/Ag/Pt or the like.

Figure 6A:
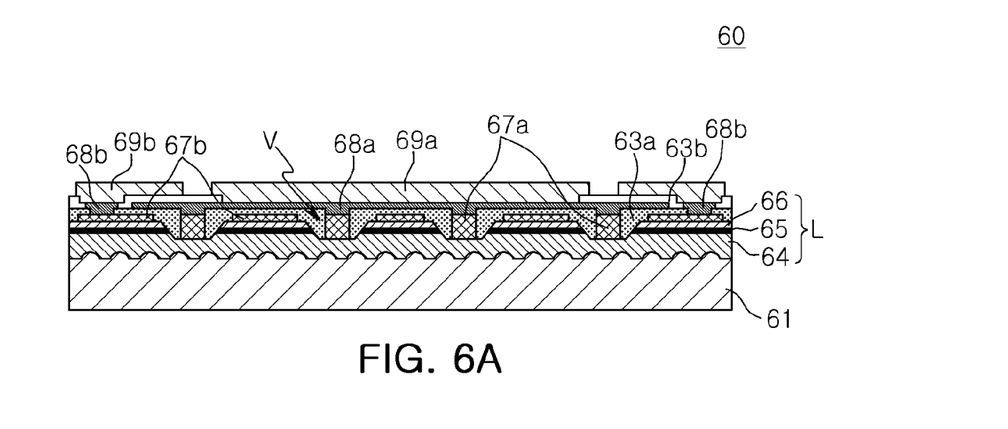
FIGS. 6A and 6B are a cross-sectional view and a plan view illustrating another example of a semiconductor light emitting device applicable to an embodiment of the present inventive concept.
Figure 6B:
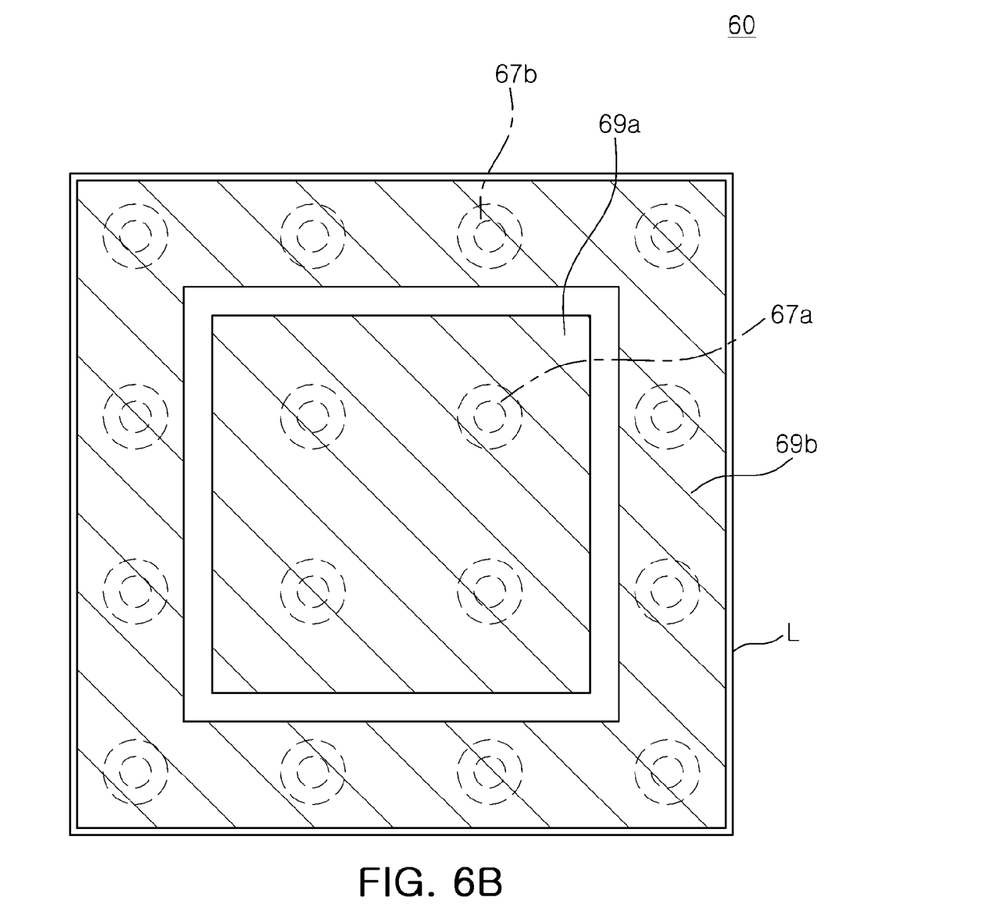

FIGS. 6A and 6B illustrate another example of a semiconductor light emitting device applicable to an embodiment of the present inventive concept.

As shown in FIG. 6A, a semiconductor light emitting device 60 may include a light emitting lamination L formed on a substrate 61. The light emitting lamination L may include first and second conductivity type semiconductor layers 64 and 66 and an active layer 65 interposed therebetween.

The semiconductor light emitting device 60 may include first and second contacts 67*a* and 67*b* formed on the first and second conductivity type semiconductor layers 64 and 66, respectively. The first and second contacts 67*a* and 67*b* may be connected to the first and second electrodes 69*a* and 69*b* by first and second electrical connection parts 68*a* and 68*b*.

The light emitting lamination L may include the first conductivity type semiconductor layer 64, the active layer 65 and the second conductivity type semiconductor layer 66 sequentially stacked on the substrate 61. The first contact 67*a* may penetrate through the second conductivity type semiconductor layer 66 and the active layer 65 and may be provided as a via V connected to the first conductivity type semiconductor layer 64. The second contact 67*b* may be formed on the second conductivity type semiconductor layer 66.

A first insulating layer 63*a* may include an open region allowing at least a portion of the first and second contacts 67*a* and 67*b* to be exposed, and the first and second electrical connection parts 68*a* and 68*b* may be connected to the first and second contacts 67*a* and 67*b*, respectively.

The first and second contacts 67*a* and 67*b* may have a single layer structure or a multilayer structure formed of a conductive material having ohmic contact with respect to the first and second conductivity type semiconductor layers 64 and 66. For example, the first and second contacts 67a and 67b may be formed by evaporation coating, sputtering or the like using at least one of Ag, Al, Ni, Cr, and a transparent conductive oxide (TCO). The first and second contacts 67a and 67b may be disposed in the same direction.

The number, shape and pitch of the first contact 67a having a conductive via structure, a contact area between the first contact 67a and the first conductivity type semiconductor layer 64, and the like, may be appropriately adjusted in order to reduce contact resistance. For example, as shown in FIG. 6B, the first contact 67a may be arranged in a matrix of rows and columns, so that current flow may be improved. The first electrical connection part 68a may allow the first contacts 67a to be connected to one another, and may be connected to the first contact 67a and the first electrode 69a.

The other electrode structure may include the second contact 67b directly formed on the second conductivity type semiconductor layer 66 and the second electrical connection part 68b formed on the second contact 67b. The second contact 67b may form an electrical ohmic contact with the second conductivity type semiconductor layer 66. In addition, since the second contact 67b is formed of a light reflective material, the second contact 67b may allow light emitted from the active layer 65 to be effectively emitted in a direction toward the substrate 61 in a state in which the light emitting lamination L is mounted in a flip-chip structure.

The above-described two electrode structures may be electrically separated by the first and second insulating layers 63a and 63b. The first insulating layer 63a serves to define a region for forming the first contact having a via structure and the second insulating layer 63b serves to separate the first and second electrode structures after the formation of the first contact.

The first and second insulating layers 63a and 63b may be formed of any material having electrically insulating properties. In addition, a material having a low degree of light absorption as well as having electrically insulating properties may be used therefor. For example, the first and second insulating layers 63a and 63b may be formed of a silicon oxide or a silicon nitride, such as $SiO_2$, $SiO_xN_y$, $Si_xN_y$ or the like. As necessary, a light reflective structure may be formed by dispersing a light reflective filler within a light transmissive material.

As described above, the first and second electrodes 69a and 69b may be connected to the first and second electrical connection parts 68a and 68b, respectively, thereby serving as external terminals of the semiconductor light emitting device 60. For example, the first and second electrodes 69a and 69b may be formed of Au, Ag, Al, Ti, W, Cu, Sn, Ni, Pt, Cr, NiSn, TiW, AuSn or eutectic metals thereof.

The semiconductor light emitting device 60 may have the first and second electrodes 69a and 69b formed on a single surface thereof. The first and second electrodes 69a and 69b may be disposed in positions corresponding to first and second electrode patterns of a packaging substrate.

In the present embodiment, as shown in FIG. 6B, the first electrode 69a may be provided in a central region of a mounting surface and the second electrode 69b may be provided to surround the first electrode 69a. The first and second electrodes 69a and 69b may be provided to correspond to electrode patterns of a packaging substrate 71 of FIG. 7, and thus, the semiconductor light emitting device 60 of FIG. 6A may be mounted on the packaging substrate 71 while preventing an electrode separation region from being externally exposed. This packaging structure will be described with reference to FIG. 7.

The substrate 61 and the light emitting lamination L may be understood based on the above descriptions provided with reference to FIG. 5, unless explicitly described to the contrary. In addition, a buffer layer (not shown) may be formed between the light emitting lamination L and the substrate 61. An un-doped semiconductor layer formed of nitrides or the like may be used as the buffer layer, thereby alleviating lattice defects in the light emitting lamination L sequentially grown thereon.

The substrate 61 may have first and second main surfaces opposing one another. As shown in FIG. 6A, at least one of the first and second main surfaces may have an unevenness structure. The unevenness structure formed on the surface of the substrate 61 may be formed by etching a portion of the substrate 61. The uneven structure may be formed of the same material as that of the substrate 61, or may be formed of a heterogeneous material.

The unevenness structure is formed on an interface between the substrate 61 and the first conductivity type semiconductor layer 64, such that light emitted from the active layer 65 may be scattered to thereby increase light extraction efficiency. Specifically, the unevenness structure may have a regular or irregular pattern. In the case in which the unevenness structure is formed of the heterogeneous material, a transparent conductor, a transparent insulator, or a high reflective material may be used. The transparent insulator may include $SiO_2$, $SiN_x$, $Al_2O_3$, HfO, $TiO_2$ or ZrO, and the transparent conductor may include a transparent conductive oxide (TCO) such as ZnO, an indium oxide containing an additive of Mg, Ag, Zn, Sc, Hf, Zr, Te, Se, Ta, W, Nb, Cu, Si, Ni, Co, Mo, Cr, or Sn, or the like. However, the material of the unevenness structure is not limited thereto.

The substrate 61 may be removed from the first conductivity type semiconductor layer 64. The removal of the substrate 61 may be performed by a laser lift off (LLO) process, an etching process or a polishing process. In addition, the unevenness structure may be formed on a surface of the first conductivity type semiconductor layer 64 from which the substrate 61 is removed.

Figure 7:
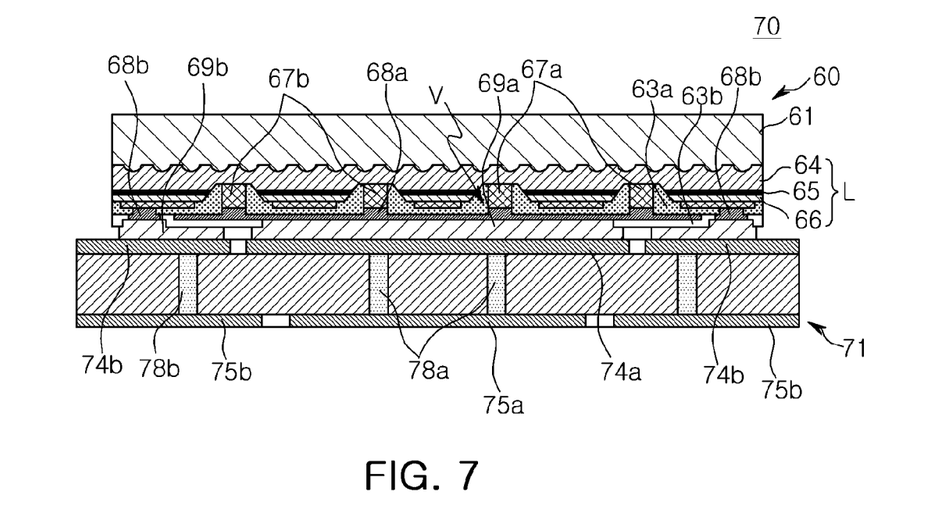
FIG. 7 is a cross-sectional view of a package to which the semiconductor light emitting device of FIGS. 6A and 6B is applied.

FIG. 7 illustrates a semiconductor light emitting device package 70 in which the semiconductor light emitting device 60 of FIG. 6A is mounted on the packaging substrate 71.

The semiconductor light emitting device package 70 of FIG. 7 may include the packaging substrate 71 and the semiconductor light emitting device 60 mounted on the packaging substrate 71.

As shown in FIG. 7, the packaging substrate 71 may include first and second electrode patterns 74a and 74b formed on a top surface thereof and first and second external terminals 75a and 75b connected to the first and second electrode patterns 74a and 74b, respectively. The packaging substrate 71 may be an insulating substrate such as a polymer substrate, a ceramic substrate or the like. The first and second electrode patterns 74a and 74b may be connected to the first and second external terminals 75a and 75b by first and second conductive vias 78a and 78b penetrating through the packaging substrate 71. The first and second electrode patterns 74a and 74b and the first and second external terminals 75a and 75b may be formed as metallic layers including Au, Cu, Ag, Al or the like.

The semiconductor light emitting device 60 may be mounted on the top surface of the packaging substrate 71, and may include the first and second electrodes 69a and 69b formed on the mounting surface thereof facing the top surface of the packaging substrate 71. As described above, in the packaging substrate 71 according to the present embodiment, the second electrode pattern 74b may be electrically insulated from the first electrode pattern 74a and may be formed to surround the first electrode pattern 74a, similarly to the arrangement of the electrode patterns of FIG. 2.

The first and second electrodes 69a and 69b may be disposed in positions corresponding to the first and second electrode patterns 74a and 74b as shown in FIG. 6B, and when mounted, the first and second electrodes 69a and 69b may be bonded to the first and second electrode patterns 74a and 74b disposed in positions corresponding thereto. Although not shown, such a bonding process may be performed using a bonding metal such as Au, Sn, or Au/Sn or a conductive polymer.

When the semiconductor light emitting device 60 is mounted on the packaging substrate 71, a eutectic metal is used in the bonding process, and thus, a separate solder bump which is generally required in a flip chip bonding scheme may not be necessary. In the mounting process, the use of a eutectic metal involves a superior heat dissipation effect as compared with the use of a solder bump. In this case, in order to achieve the superior heat dissipation effect, the first and second electrodes 69a and 69b may occupy large areas.

As shown in FIG. 6B, in the semiconductor light emitting device 60 employed in the present embodiment, the first electrode 69a may be provided in a central region of the mounting surface so as to correspond to a region in which the first electrode pattern 64a is formed, and the second electrode 69b may be provided to surround the first electrode 69a and be positioned to correspond to a region in which the second electrode pattern 74b is formed.

Therefore, in the state in which the semiconductor light emitting device 60 is mounted on the top surface of the packaging substrate 71, an electrode separation region between the first and second electrode patterns 74a and 74b may not be exposed externally.

As shown in FIG. 7, in the case in which the second electrode pattern 74b has an exposed region around the edges of the semiconductor light emitting device 60 and the second electrode pattern 74b completely surrounds the first electrode pattern 74a, the exposed region of the second electrode pattern 74b is provided as a continuous reflective surface, whereby a superior reflective effect may be achieved and a radiation pattern having a small degree of deviation in a path of emitted light depending on an orientation angle of light may be obtained.

The present inventive concept may be applied to various packages including a pair of electrode structures. As an example of such a semiconductor light emitting device package, there is provided a chip scale package (CSP) to which the present inventive concept may be usefully applicable.

The chip scale package is suitable for mass production by reducing a size of the package and simplifying a manufacturing process and can be manufactured to allow an LED chip to be integrated with a wavelength conversion material such as a phosphor and an optical structure such as a lens, and thus, the chip scale package may be appropriately applied to a lighting device.

Figure 8:
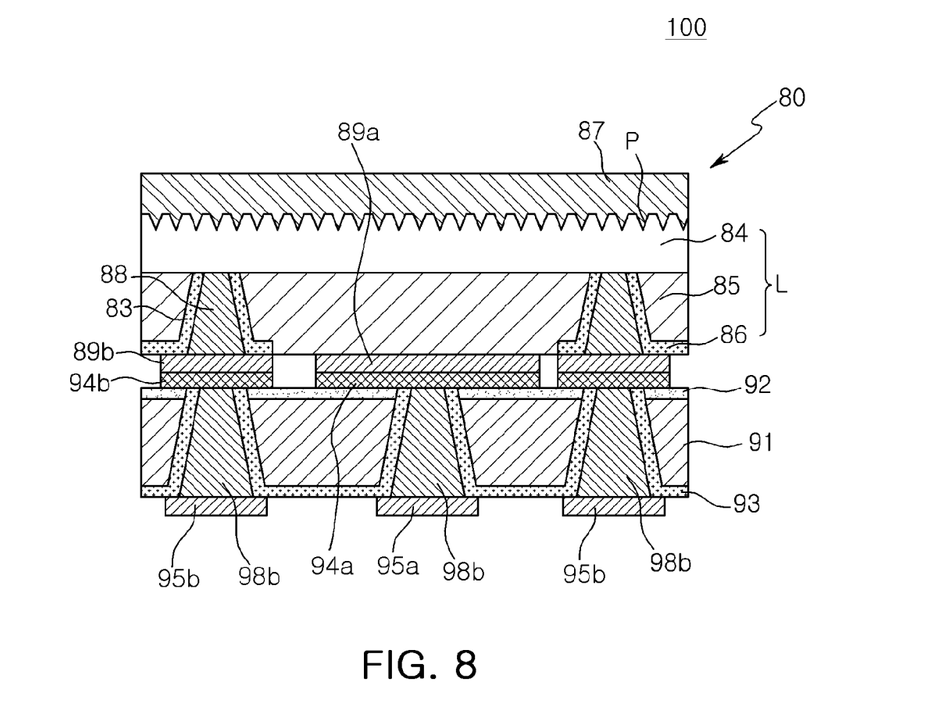
FIG. 8 is a cross-sectional view of a chip scale package (CSP) according to another embodiment of the present inventive concept.

FIG. 8 illustrates a chip scale package as a specific example of a semiconductor light emitting device package.

A chip scale package 100 of FIG. 8 may include a packaging substrate 91 and a semiconductor light emitting device 80 mounted on the package substrate 91.

A light emitting lamination L forming the semiconductor light emitting device 80 may be formed as a lamination including first and second conductivity type semiconductor layers 84 and 86 and an active layer 85 interposed therebetween. In the present embodiment, the first and second conductivity type semiconductor layers 84 and 86 may be p-type and n-type semiconductor layers, respectively, and may be formed of nitride semiconductors, for example, $Al_xIn_yGa_{(1-x-y)}N$ ($0 \leq x \leq 1$, $0 \leq y \leq 1$, $0 \leq x+y \leq 1$). GaAs-based semiconductors or GaP-based semiconductors besides nitride semiconductors may also be used therefor.

The active layer 85 interposed between the first and second conductivity type semiconductor layers 84 and 86 may emit light having a predetermined level of energy through electron-hole recombination, and may have a multi-quantum well (MQW) structure in which quantum well layers and quantum barrier layers are alternately laminated. For example, in the case of a multi-quantum well (MQW) structure, a GaN/InGaN structure, a AlGaN/GaN structure or the like may be used.

Meanwhile, the first and second conductivity type semiconductor layers 84 and 86 and the active layer 85 may be formed by a semiconductor growth process known in the art such as metal organic chemical vapor deposition (MOCVD), molecular beam epitaxy (MBE), hydride vapor phase epitaxy (HVPE) or the like.

In FIG. 8, the semiconductor light emitting device 80 is illustrated in a state in which a growth substrate has been removed therefrom, and an unevenness structure P may be formed on a surface of the semiconductor light emitting device 80 from which the growth substrate has been removed. In addition, a phosphor layer 87 may be provided on the surface having the unevenness structure P formed thereon as a light conversion layer.

The semiconductor light emitting device 80 may include first and second electrodes 89a and 89b connected to the first and second conductivity type semiconductor layers 84 and 86, respectively. The first electrode 89a may include a conductive via 88 penetrating through the second conductivity type semiconductor layer 86 and the active layer 85 and connected to the first conductivity type semiconductor layer 84. An insulating layer 83 may be formed between the conductive via 88 and the semiconductor layers, i.e., the second conductivity type semiconductor layer 86 and the active layer 85, so that short circuits may be prevented thereby.

In the present embodiment, two conductive vias 88 are provided; however, three or more conductive vias may be provided and arranged in various forms in order to be advantageous for current distribution.

The packaging substrate 91 may include first and second electrode patterns 94a and 94b formed on a top surface thereof and first and second external terminals 95a and 95b formed on a bottom surface thereof, the first and second electrode patterns 94a and 94b being connected to the first and second external terminals 95a and 95b, respectively. The first and second electrode patterns 94a and 94b and the first and second external terminals 95a and 95b may be connected to one another by conductive vias 98a and 98b. The packaging substrate 91 may be a silicon substrate or the like to which a semiconductor process can be easily applied. Therefore, insulating layers 92 and 93 may be formed on a surface of the packaging substrate and sidewalls of the conductive vias such that the electrode structures may be electrically separated from one another.

The first and second electrode patterns 94a and 94b of the packaging substrate 91 may be positioned to correspond to the first and second electrodes 89a and 89b of the semiconductor light emitting device 80.

In the packaging substrate 91, the second electrode pattern 94b may be electrically insulated from the first electrode pattern 94a and may be formed to surround the first electrode pattern 94a. Since the second electrode pattern 94b is formed to surround the first electrode pattern 94a, an electrode separation region may have a closed form.

In the present embodiment, the first and second electrodes 89a and 89b may be positioned to correspond to the first and second electrode patterns 94a and 94b and the first and second electrodes 89a and 89b may be bonded to the first and second electrode patterns 94a and 94b disposed in positions corresponding thereto, when mounted. Although not shown, the bonding process may be performed using a bonding metal such as Au, Sn, or Au/Sn or a conductive polymer. For example, in the case of a chip scale package process as in the present embodiment, the bonding process may be implemented by a wafer-to-wafer direct bonding method.

Similar to the embodiment of FIG. 2, according to the present embodiment, the first and second electrodes 89a and 89b of the semiconductor light emitting device 80 may be disposed in a manner similar to the arrangement of the first and second electrode patterns 94a and 94b. Therefore, in the case in which the semiconductor light emitting device 80 is mounted on the packaging substrate 91 and the first and second electrodes 89a and 89b are bonded to the first and second electrode patterns 94a and 94b, respectively, the electrode separation region S between the first and second electrode patterns 94a and 94b may not be exposed externally. That is, the second electrode 89b of the semiconductor light emitting device 80 may be continuously bonded to the second electrode pattern 94b of the packaging substrate 91, such that the electrode separation region S may be sealed.

In particular, in the chip scale package of the present embodiment, a wafer-to-wafer bonding process is usually used, and it is difficult to apply a protective material between one wafer (device) and the other wafer (packaging substrate). Unless the electrode patterns have a closed electrode structure, the reliability of the device may be degraded.

As set forth above, in a packaging substrate for an electronic device according to embodiments of the present inventive concept, one electrode pattern (first electrode pattern) is surrounded by the other electrode pattern (second electrode pattern), and an electrode separation region is encompassed by a mounting region of an electronic device, whereby the electrode separation region is not exposed externally. Therefore, a reduction in reliability of the electronic device due to the permeation of moisture or foreign objects may be prevented, and an encapsulation process such as an underfill process may be simplified or omitted.

In the case of using an optoelectronic device such as a semiconductor light emitting device, the second electrode pattern is provided to continuously surround edges of the optoelectronic device, and thus, light reflective characteristics may be improved and a relatively uniform radiation pattern may be obtained across the entire orientation angle of light.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:
1. An electronic device package comprising:
   a packaging substrate having first and second surfaces opposing one another, the packaging substrate including:
      first and second electrode patterns formed on the first surface of the packaging substrate, and
      first and second external terminals connected to the first and second electrode patterns,
      the second electrode pattern being electrically insulated from the first electrode pattern and substantially completely surrounding the first electrode pattern; and
   an electronic device mounted on the first surface of the packaging substrate, the electronic device including:
      first and second electrodes formed on a surface thereof facing the packaging substrate, and
      the first and second electrodes being positioned on the first and second electrode patterns, respectively.

2. The electronic device package of claim 1, further comprising:
   a first conductive via penetrating through the packaging substrate to connect the first electrode pattern to the first external terminal,
   wherein the first external terminal is disposed on the second surface of the packaging substrate.

3. The electronic device package of claim 2, further comprising:
   a second conductive via penetrating through the packaging substrate to connect the second electrode pattern to the second external terminal,
   wherein the second external terminal is disposed on the second surface of the packaging substrate.

4. The electronic device package of claim 1, wherein the first and second electrode patterns are separated from one another by an electrode separation region that has a closed form.

5. An electronic device package comprising:
   a packaging substrate having first and second surfaces opposing one another, the packaging substrate including:
      first and second electrode patterns formed on the first surface of the packaging substrate, and
      first and second external terminals connected to the first and second electrode patterns,
      the second electrode pattern being electrically insulated from the first electrode pattern and surrounding the first electrode pattern; and
   an electronic device mounted on the first surface of the packaging substrate, the electronic device including:
      first and second electrodes formed on a surface thereof facing the packaging substrate, and
      the first and second electrodes being positioned on the first and second electrode patterns, respectively,
      wherein the first electrode pattern includes a plurality of first electrode patterns separated from one another.

6. The electronic device package of claim 1, wherein the second electrode is separated from the first electrode and is provided to surround the first electrode.

7. The electronic device package of claim 6, wherein the second electrode pattern and the second electrode are bonded to one another and an internal space defined by a bonding region thereof is sealed.

8. The electronic device package of claim 1, wherein the second electrode is disposed around the first electrode and includes a plurality of second electrodes separated from one another.

9. The electronic device package of claim 8, wherein the plurality of second electrodes are symmetrically arranged based on the first electrode.

10. The electronic device package of claim 1, wherein the first and second electrodes of the electronic device have thicknesses less than those of the first and second electrode patterns.

11. The electronic device package of claim 1, wherein the electronic device is an optoelectronic device.

12. The electronic device package of claim 11, wherein a portion of the second electrode pattern is continuously exposed along edges of the electronic device.

13. A packaging substrate for an electronic device, the packaging substrate comprising:
   a substrate body having first and second surfaces opposing one another;
   a first electrode pattern disposed on the first surface of the substrate body;
   a second electrode pattern disposed on the first surface of the substrate body, electrically insulated from the first electrode, and substantially completely surrounding the first electrode pattern; and
   first and second external terminals connected to the first and second electrode patterns, respectively,
   wherein the first electrode pattern includes a plurality of first electrode patterns separated from one another.

* * * * *